(12) United States Patent  
Alvarez-Herault et al.

(10) Patent No.: US 8,885,379 B2  
(45) Date of Patent: Nov. 11, 2014

(54) HIGH SPEED MAGNETIC RANDOM ACCESS MEMORY-BASED TERNARY CAM

(71) Applicant: CROCUS Technology SA, Grenoble Cedex (FR)

(72) Inventors: Jeremy Alvarez-Herault, Grenoble (FR); Yann Conraux, Grenoble (FR); Lucien Lombard, Grenoble (FR)

(73) Assignee: CROCUS Technology SA, Grenoble Cedex (FR)

( * ) Notice: Subject to any disclaimer, the term of this patent is extended or adjusted under 35 U.S.C. 154(b) by 119 days.

(21) Appl. No.: 13/764,139

(22) Filed: Feb. 11, 2013

(65) Prior Publication Data

US 2013/0208523 A1   Aug. 15, 2013

(30) Foreign Application Priority Data

Feb. 13, 2012   (EP) .................................... 12290052

(51) Int. Cl.
*G11C 15/02* (2006.01)
*G11C 15/04* (2006.01)
*G11C 11/16* (2006.01)

(52) U.S. Cl.
CPC .............. *G11C 15/02* (2013.01); *G11C 15/046* (2013.01); *G11C 11/16* (2013.01); *G11C 2211/5615* (2013.01)
USPC .......................................... 365/50; 365/49.11

(58) Field of Classification Search
USPC ................................................ 365/50, 49.11
See application file for complete search history.

(56) References Cited

U.S. PATENT DOCUMENTS

| 2008/0197431 A1 | 8/2008 | Morise et al. |
| 2010/0110744 A1 | 5/2010 | El Baraji et al. |
| 2012/0218802 A1* | 8/2012 | Marukame et al. ............. 365/50 |

FOREIGN PATENT DOCUMENTS

EP          2204814 A1       7/2010

OTHER PUBLICATIONS

Wei Xu et al., "Spin-transfer Torque Magnoresistive Content Addressable Memory (CAM) Cell Structure Design with Enhanced Search Noise Margin", Circuits and Systems, 2008. ISCAS 2008. IEEE International Symposium on, IEEE, Piscataway, NJ, USA, May 18, 2008, pp. 1898-1901.
European Search Report dated Jul. 26, 2012 for EP12290052.5.

* cited by examiner

*Primary Examiner* — Michael Tran
(74) *Attorney, Agent, or Firm* — Pearne & Gordon LLP

(57) ABSTRACT

The present disclosure concerns a self-referenced magnetic random access memory-based ternary content addressable memory (MRAM-based TCAM) cell comprising a first and second magnetic tunnel junction; a first and second conducting strap adapted to pass a heating current in the first and second magnetic tunnel junction, respectively; a conductive line electrically connecting the first and second magnetic tunnel junctions in series; a first current line for passing a first field current to selectively write a first write data to the first magnetic tunnel junction; and a second current line for passing a write current to selectively write a second write data to the second magnetic tunnel junction, such that three distinct cell logic states can be written in the MRAM-based TCAM cell.

15 Claims, 3 Drawing Sheets

HIGH SPEED MAGNETIC RANDOM ACCESS MEMORY-BASED TERNARY CAM

FIELD

The present disclosure concerns a self-referenced magnetic random access memory-based ternary content addressable memory (MRAM-based TCAM) cell allowing for performing a write and search operation at high-speed and writing up to three distinct cell logic states in the MRAM-based TCAM cell. The disclosure also concerns a method for writing and searching the cell.

BACKGROUND

Content Addressable Memory (CAM) is an outgrowth of Random Access memory (RAM) technology. Unlike RAMs which access a word based on its address, CAMs access a word based on its contents. A CAM stores data in a similar fashion to a conventional RAM. However, "reading" the CAM involves providing input data to be matched, then searching the CAM for a match so that the address of the match can be output. A CAM is designed such that the user supplies a data word and the CAM searches its entire memory in one-clock cycle to see if that data word is stored anywhere in it. If the data word is found, the CAM returns a list of one or more storage addresses where the word was found. The CAM can be preloaded at device start-up and rewritten during device operation.

To search the entire memory quickly, CAM employs separate match logic per each memory row. When a search key is presented by the user, each search key bit will become visible to all the match logic cells in a column at the same time. Each row of match logic cells will then perform a bit-by-bit comparison between the provided search key and the stored key in the associated memory row. Comparison results will be reduced to a binary value (e.g., 1 for match and 0 for mismatch) and are fed into a priority encoder, which finally produces the search result. Since comparisons for all the memory rows are performed in parallel, CAM achieves high-bandwidth, constant-time search performance.

CAMs, and specifically Ternary CAMs (TCAMs), are also mostly used in networking devices. They provide read and write such as normal memory, but additionally support search which will find the index of any matching data in the entire memory. A TCAM in particular can include wildcard bits which will match both one and zero. Theses wildcards can be used on both the access operations of the memory (indicating some bits of the search are "don't care") or can be stored with the data itself (indicating some bits of the data should not be used for determining a match). When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Therefore a TCAM can perform a partial matching. The fully parallel search provided by TCAM eases the implementation of many complex operations such as routing table lookup. Because the TCAM searches every location in memory at once, the ordering of the element in the TCAM is less important and large indexing structures can often times be entirely avoided. This parallel search directly implements the requirements of some applications (such IP-Lookup), and can serve as the building block of more searching schemes. TCAM is also used in other high-speed networking applications such as packet classification, access list control, pattern matching for intrusion detection. TCAM are also being used with network processors as a co-processor to complement the network processors in several applications such as packet classification and routing lookup.

A typical implementation of a static random access memory (SRAM) TCAM cell consists of a ternary storage containing two SRAM cells which combines ten to twelve transistors. It also has a comparison logic, which is basically a XNOR gate using four additional pass transistors. Hence very large cells size of fourteen to sixteen transistors, hence a costly device.

Unlike a RAM chip, which has simple storage cells, each individual memory bit in a fully parallel TCAM has its own associated comparison circuit to detect a match between the stored data bit and the input data bit. TCAM chips are thus considerably smaller in storage capacity than regular memory chips. Additionally, match outputs from each cell in the data word can be combined to yield a complete data word match signal. The associated additional circuitry further increases the physical size of the TCAM chip. Furthermore, CAM and TCAM as it is done today (using SRAM elements) is intrinsically volatile, meaning that the data are lost when the power is turned off. As a result, every comparison circuit needs being active on every clock cycle, resulting in large power dissipation. With a large price tag, high power and intrinsic volatility, TCAM is only used in specialized applications where searching speed cannot be accomplished using a less costly method.

A random access CAM having magnetic tunnel junction-based memory cells has been proposed in patent application WO2008/040561 by the present applicant. Here, the magnetic tunnel junction has first and second magnetic layers and can act as a data store and a data sense. Within each cell, registered data is written by setting a magnetic orientation of the first magnetic layer in the magnetic tunnel junction via current pulses in one or more current lines. Input data for comparison with the registered data can be similarly set through the magnetic orientation of the second magnetic layer via the current lines. The data sense is performed by measuring cell resistance, which depends upon the relative magnetic orientation of the magnetic layers. Since data storage, data input, and data sense are integrated into one cell, the memory combines higher densities with non-volatility.

Emerging memory technology and high-speed lookup-intensive applications are demanding ternary content addressable memories with large word sizes, which suffer from lower search speeds due to large cell capacitance.

European Patent EP2204814 discloses a magnetic random access memory-based ternary content addressable memory (MRAM-based TCAM) cell comprising two magnetic tunnel junctions; a distinct sense line being coupled to each magnetic tunnel junction; a second field line, and another field line orthogonal with the field line, common to the two magnetic tunnel junctions. The MRAM-based TCAM cell can store data with a high or low logic state as well as with a masked logic state.

The disclosed MRAM-based TCAM, however, cannot reliably store more than two resistance states. Moreover the MRAM-based TCAM cell using two perpendicular field lines cannot easily be made compact in size.

SUMMARY

The present disclosure concerns a self-referenced magnetic random access memory-based ternary content addressable memory (MRAM-based TCAM) cell comprising a first magnetic tunnel junction and a second magnetic tunnel junction, each magnetic tunnel junction comprising a search layer having a search magnetization that can be freely varied, a storage layer having a storage magnetization that can be switched from a first stable direction to a second stable direction when the magnetic tunnel junction is at a high temperature threshold; and a tunnel barrier layer between the search and storage layers; a first conducting strap in electrical communication with one end of the first magnetic tunnel junction; a second conducting strap in electrical communication with one end of the second magnetic tunnel junction; a conductive line in electrical communication with the other end of the first and second magnetic tunnel junctions such that the two magnetic tunnel junctions are connected in series; a first current line adapted to pass a first field current generating a first magnetic field for writing a first write data to the first magnetic tunnel junction; and a second current line adapted to pass a write current independently from passing the first field current in the first current line for writing a second write data to the second magnetic tunnel junction selectively from the writing of the first write data, such that three distinct cell logic states can be written in the MRAM-based TCAM cell.

In an embodiment, the write current comprises a second field current generating a second magnetic field.

In another embodiment, the write current further comprises a heating current, and wherein the cell is arranged for passing the heating current in the two magnetic tunnel junctions via the conductive line, the first strap, and the second strap, such that the two magnetic tunnel junctions can be simultaneously heated at the high temperature threshold.

In yet another embodiment, the write current comprises a heating current and wherein the second current line is electrically connected to the conductive line such that the heating current can selectively pass in each of the two magnetic tunnel junctions via a portion of the conductive line and the second current line, such that each of the two magnetic tunnel junctions can be heated selectively.

In yet another embodiment, the write current further comprises a second field current, and wherein the cell is arranged for passing the second field current in the first current line.

The present disclosure further concerns a magnetic memory device comprising a plurality of the MRAM-based TCAM cell.

The present disclosure also pertains to a method of writing to the MRAM-based TCAM cell, comprising selectively writing a first write data to the first magnetic tunnel junction and selectively writing a second write data to the second magnetic tunnel junction, such as to write a cell logic state in the MRAM-based TCAM cell.

In an embodiment, said write current comprises a second field current generating a second magnetic field, and said selectively writing a first and second write data to the first and second magnetic tunnel junction, respectively, comprises:

heating the first and second magnetic tunnel junctions to the high temperature threshold; and passing the first field current having a first polarity in the first current line for switching the storage magnetization of the first magnetic tunnel junction in accordance with the first polarity; and passing the second field current having a second polarity in the second current line for switching the storage magnetization of the second magnetic tunnel junction in accordance with the second polarity.

In another embodiment, said write current further comprises a heating current, and wherein said heating the first and second magnetic tunnel junction comprises passing the heating current in the two magnetic tunnel junctions via the conductive line, the first strap, and the second strap.

In yet another embodiment, said write current comprises a heating current, and said second current line is electrically connected with the conductive line; and said selectively writing a first and second write data to the first and second magnetic tunnel junction, respectively, comprises:

selectively heating the first magnetic tunnel junction to the high temperature threshold passing the first field current having a first polarity in the first current line for switching the storage magnetization of the first magnetic tunnel junction in accordance with the first polarity;

selectively heating the second magnetic tunnel junction to the high temperature threshold; and passing a second field current having a second polarity in the first current line for switching the storage magnetization of the second magnetic tunnel junction in accordance with the current polarity.

In yet another embodiment, said selectively heating the first magnetic tunnel junction comprises passing the heating current in the first magnetic tunnel junction via the second current line, a first portion of the conductive line, and the first strap; and said selectively heating the second magnetic tunnel junction comprises passing the heating current in the second magnetic tunnel junction via the second current line, a second portion of the conductive line, and the second strap.

In yet another embodiment, the first polarity is the same as the second polarity such as to write a high ("1") or a low ("0") cell logic state in the MRAM-based TCAM cell; or the first polarity is opposite to the second polarity such as to write a don't-care ("X") cell state logic state in the MRAM-based TCAM cell.

The present disclosure further concerns a method of searching the MRAM-based TCAM cell, comprising:

aligning the search magnetization of the first and second magnetic tunnel junctions in a first search direction;

measuring first cell resistance;

aligning the search magnetization of the first and second magnetic tunnel junctions in a second search direction;

measuring second cell resistance; and determining the cell logic state by the difference between the first and second cell resistance.

In an embodiment, said aligning the search magnetization in a first search direction comprises passing a search current having a first polarity in the first and/or second current lines, and said aligning the search magnetization in a second search direction comprises passing the search current having a second polarity, opposed to the first, in the first and/or second current lines.

In another embodiment, said measuring first and second cell resistances comprises passing a search current in the first and second magnetic tunnel junctions via the conductive line and the first and second straps.

The MRAM-based TCAM cell disclosed herein allows for performing the write and search operations with high-speed and writing up to three distinct cell logic states in the MRAM-based TCAM cell.

BRIEF DESCRIPTION OF THE DRAWINGS

The disclosure will be better understood with the aid of the description of an embodiment given by way of example and illustrated by the figures, in which.

DETAILED DESCRIPTION OF POSSIBLE EMBODIMENTS

Figure 1:
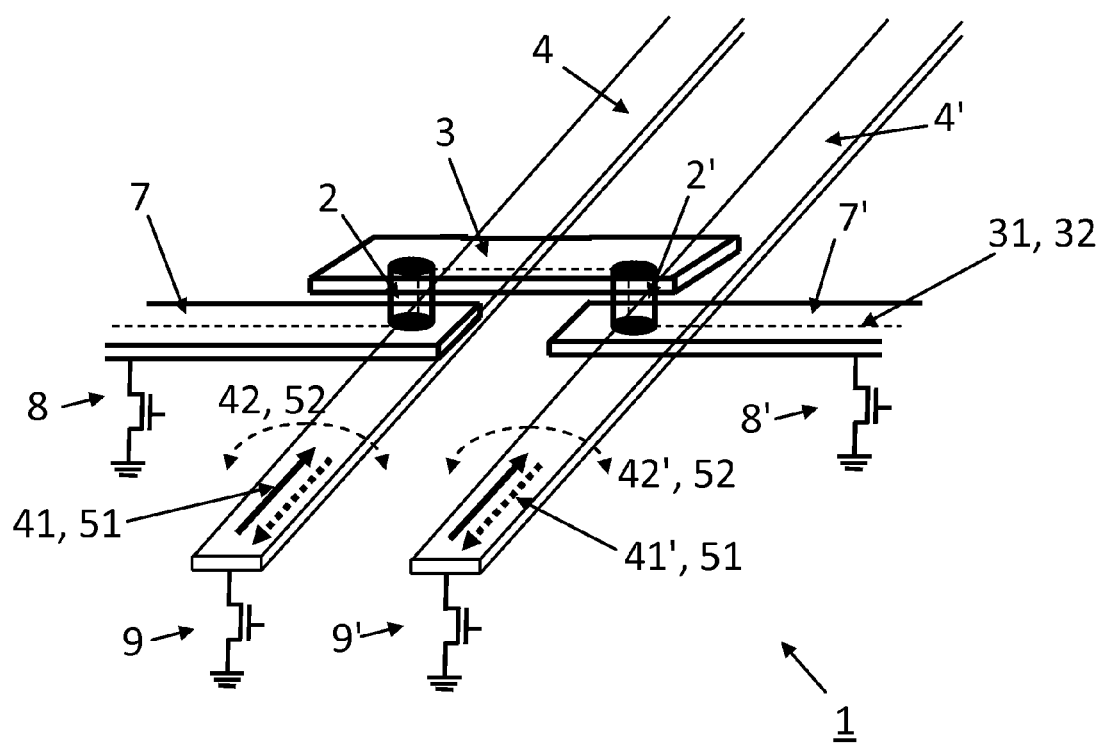
FIG. 1 shows a MRAM-based TCAM cell comprising a first and second magnetic tunnel junction, according to an embodiment.

In an embodiment represented in FIG. 1, a self-referenced magnetic random access memory-based ternary content addressable memory (MRAM-based TCAM) cell 1 comprises a first magnetic tunnel junction 2, a second magnetic tunnel junction 2', a first conducting strap 7 in electrical communication with one end of the first magnetic tunnel junction 2, a second conducting strap 7' in electrical communication with the one end of the second magnetic tunnel junction 2', each of the first and second straps 7, 7' extending laterally on one side of the first and second magnetic tunnel junctions 2, 2', respectively. The MRAM-based TCAM cell 1 further comprises a conductive line 3 in communication with the other end of the first and second magnetic tunnel junction 2, 2', respectively, such that the two magnetic tunnel junctions 2, 2' are electrically connected in series. Each magnetic tunnel junction 2, 2' can comprise a search layer 21 having a search magnetization 210 that can be freely varied; a storage layer 23 having a storage magnetization 230 that can be switched from a first stable direction to a second stable direction; and a tunnel barrier layer 22 between the search and storage layers 21, 23. The MRAM-based TCAM cell 1 further comprises a first selection transistor 8 electrically connected to an end of the first strap 7, opposite to the one connected to the first magnetic tunnel junction 2. A second selection transistor 8' is connected to the end of the second strap 7', opposite to the one connected to the second magnetic tunnel junction 2'. In this configuration, a write current, or heating current 31, can be passed in the two magnetic tunnel junctions 2, 2' and the conductive line 3, via the first and second straps 7, 7'.

The MRAM-based TCAM cell 1 further comprises a first current line 4 in communication with the first magnetic tunnel junction 2, and a second current line 4' in communication with the second magnetic tunnel junction 2'. The first current line 4 is arranged for passing a first field current 41 such as to generate a first magnetic field 42. The write current further comprises second field current 41' and the second current line 4' is arranged for passing the second field current 41' independently from the first field current 41, such as to generate a second magnetic field 42'. In the example of FIG. 1, the first current line 4 is substantially parallel with the second current line 4'.

Write Operation

According to an embodiment, a write operation of the MRAM-based TCAM cell 1 comprises selectively writing a first write data to the first magnetic tunnel junction 2, and selectively writing a second write data to the second magnetic tunnel junction 2'. Writing the first and second write data can comprise heating the first and second magnetic tunnel junctions 2, 2' to a high temperature threshold; switching the storage magnetization 230 of the first magnetic tunnel junction 2 in a first write direction, and switching the storage magnetization 230 of the second magnetic tunnel junction 2' in a second write direction; and cooling the first and second magnetic tunnel junctions 2, 2' to a low temperature threshold at which the storage magnetization 230 is frozen in the written state.

Heating the first and second magnetic tunnel junctions 2, 2' to the high temperature threshold can be performed by passing the heating current 31 in the magnetic tunnel junctions 2, 2' via the conductive line 3 and the straps 7, 7', when the first and second select transistor 8, 8' are in a passing mode. In the case the storage layer 23 of the first and second magnetic tunnel junction 2, 2' is exchange-coupled by an antiferromagnetic layer (not shown), the high temperature threshold should be at or above a critical temperature of the antiferromagnetic layer, where the exchange-coupling vanishes and the storage layer 23 is no more pinned by the antiferromagnetic layer and can be freely adjusted. Since the heating current 31 passes in the two magnetic tunnel junctions 2, 2', both magnetic tunnel junctions 2, 2' are simultaneously heated at the high temperature threshold.

Switching the storage magnetization 230 of the first magnetic tunnel junction 2 in a first write direction can comprise passing the first field current 41 with a first polarity in the first current line 4. Switching the storage magnetization 230 of the second magnetic tunnel junction 2' in the second write direction can comprise passing the second field current 41' with a second polarity in the second current line 4'. Passing the first field current 41 in the first current line 4 can be achieved by setting the first field select transistor 9 in a passing mode. Passing the second field current 41' in the second current line 4', independently from the first field current 41, can be achieved by setting the second field select transistor 9' in the passing mode. The polarity of the first field current 41 can be the same or opposite to the one of the second field current 41'. Moreover, switching the storage magnetization 230 of the first and second magnetic tunnel junctions 2, 2' can be done simultaneously, allowing for performing the write operation with high-speed.

Search Operation

According to an embodiment, a self-referenced search operation can comprise the steps of aligning the search magnetization 210 of the first and second magnetic tunnel junctions 2, 2' in a first search direction; and comparing the first and second write data with the search magnetization 210 aligned in the first search direction. The search operation can further comprise aligning the search magnetization 210 of the first and second magnetic tunnel junctions 2, 2' in a second search direction; and comparing the first and second write data with the search magnetization 210 aligned in the second search direction. Aligning the search magnetization 210 can be performed by passing a search current 51 in the first and second current lines 4, 4' such as to generate a search magnetic field 52. The search magnetization 210 is aligned in the first and second search directions in accordance with the polarity of the search current 51. The relative orientation of the search magnetization 210 with the storage magnetization 230 will determine a first junction resistance $R_{mtj1}$ of the first magnetic tunnel junction 2 and a second junction resistance $R_{mtj2}$ of the second magnetic tunnel junction 2'. Alternatively, the search current 51 can be passed only in the first current line 4 or only in the second current line 4'.

Comparing the first and second write data with the search magnetization 210 aligned in the first or second search direction can be performed by measuring a first and second cell resistance $R_{C1}$, $R_{C2}$, respectively. This can be performed by passing a search current 32 in the first and second magnetic tunnel junctions 2, 2' via the conductive line 3 and the first and second straps 7, 7', when aligning the search magnetization 210. The first cell resistance $R_{C1}$ corresponds to the first junction resistance $R_{mtj1}$ in series with the second junction resistance $R_{mtj2}$, when the search magnetization 210 is aligned in the first search direction. The second cell resistance $R_{C2}$ corresponds to the first junction resistance $R_{mtj1}$ in series with the second junction resistance $R_{mtj2}$, when the search magnetization 210 is aligned in the second search direction. The search current 51 can be alternating such that the search magnetization 210 is successively aligned in the first and second search direction with the change in polarity of the alternating search current 51.

Figure 3:
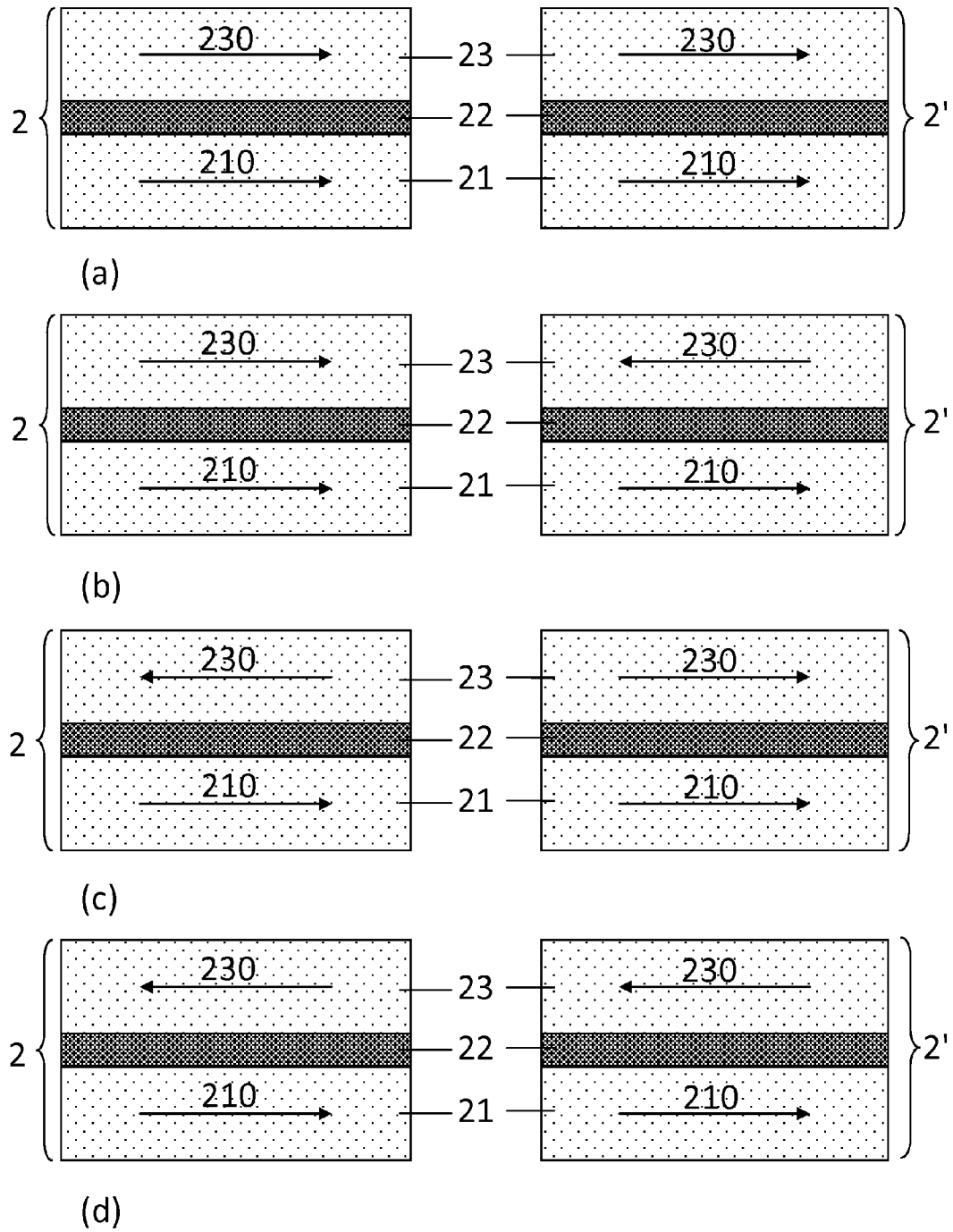
FIGS. 3a to 3d represent different configurations of a storage magnetization and a search magnetization of the first and second magnetic tunnel junctions.

FIGS. 3a to 3d represent different configurations of the storage and search magnetizations 230, 210 for the first and second magnetic tunnel junctions 2, 2'. In the figures, the search magnetization 210 of the first and second magnetic tunnel junctions 2, 2' is aligned in a first search direction, towards the right in the figures. More particularly, in FIG. 3a both the first and second write data correspond to a state "0", i.e., the storage magnetization 230 of both first and second magnetic tunnel junctions 2, 2' are oriented substantially parallel with the search magnetization 210. The measured first and second junction resistances $R_{mtj1}$, $R_{mtj2}$ are thus minimum ($R_{min}$) and the first cell resistance $R_{C1}$ is also minimum ($R_{C1}=2\,R_{min}$). In FIG. 3b, the first write data corresponds to a state "0" and the second write data corresponds to a state "1". Here, the storage magnetization 230 of the first and second magnetic tunnel junction 2, 2' is oriented, respectively, substantially parallel and antiparallel to the search magnetization 210. The measured first junction resistance $R_{mtj1}$ is minimum ($R_{min}$), and the measured second junction resistance $R_{mtj2}$ is maximum ($R_{max}$), yielding an intermediate value $R_{min}+R_{max}$ of the first cell resistance $R_{C1}$. In FIG. 3c, the first write data corresponds to a state "1" and the second write data corresponds to a state "0", i.e., the storage magnetization 230 of the first and second magnetic tunnel junction 2, 2' is oriented, respectively, substantially antiparallel and parallel to the search magnetization 210. The measured first junction resistance $R_{mtj1}$ is maximum ($R_{max}$) and the measured second junction resistance $R_{mtj2}$ is minimum ($R_{min}$), yielding another intermediate value $R_{max}+R_{min}$ of the first cell resistance $R_{C1}$. In FIG. 3d, both the first and second write data correspond to a state "1", i.e., the storage magnetization 230 of both first and second magnetic tunnel junctions 2, 2' are oriented substantially antiparallel with the search magnetization 210. The measured first and second junction resistances $R_{mtj1}$, $R_{mtj2}$ are maximum ($R_{max}$) and the first cell resistance $R_{C1}$ is also maximum ($R_{C1}=2\,R_{max}$). Table 1 summarizes the values of the first and second junction resistances $R_{mtj1}$, $R_{mtj2}$ and the corresponding first cell resistance $R_{C1}$.

TABLE 1

|   | $R_{MTJ1}$ | $R_{MTJ2}$ | $R_{C1}$ |
|---|---|---|---|
| a | $R_{min}$ | $R_{min}$ | $2\,R_{min}$ |
| b | $R_{min}$ | $R_{max}$ | $R_{min}+R_{max}$ |
| c | $R_{max}$ | $R_{min}$ | $R_{min}+R_{max}$ |
| d | $R_{max}$ | $R_{max}$ | $2\,R_{max}$ |

Table 2 summarizes the values of the first and second junction resistances $R_{mtj1}$, $R_{mtj2}$ and the corresponding second cell resistance $R_{C2}$ determined when the search magnetization 210 of the first and second magnetic tunnel junctions 2, 2' is aligned in the second search direction, opposed to the first search direction. The first and second magnetic tunnel junctions 2, 2' are written with the same sequence of the first and second write data as in FIGS. 3a to 3d.

TABLE 2

|   | $R_{MTJ1}$ | $R_{MTJ2}$ | $R_{C2}$ |
|---|---|---|---|
| a | $R_{max}$ | $R_{max}$ | $2\,R_{max}$ |
| b | $R_{max}$ | $R_{min}$ | $R_{min}+R_{max}$ |
| c | $R_{min}$ | $R_{max}$ | $R_{min}+R_{max}$ |
| d | $R_{min}$ | $R_{min}$ | $2\,R_{min}$ |

The search operation can further comprise a step of comparing the value of the first cell resistance $R_{C1}$ with the value of the second cell resistance $R_{C2}$. For example, when the first and second write data correspond to the state "0", the difference $\Delta R$ between the first cell resistance $R_{C1}$ and the second cell resistance $R_{C2}$ ($\Delta R=2R_{min}-2R_{max}$) will yield a negative value, and thus a cell logic state "0" of the MRAM-based TCAM cell 1. When the first and second write data correspond to the state "1", the difference $\Delta R$ between the first cell resistance $R_{C1}$ and the second cell resistance $R_{C2}$ ($\Delta R=2R_{max}-2R_{min}$) will yield a positive value, and thus a cell logic state "1" of the MRAM-based TCAM cell 1. When the first and second write data corresponds either to the state respectively "0" and "1", or respectively "1" and "0", the difference $\Delta R$ between the first cell resistance $R_{C1}$ and the second cell resistance $R_{C2}$ is substantially the same ($\Delta R=0$), corresponding to a cell logic state "X" (don't-care) of the MRAM-based TCAM cell 1. Table 3 summarizes the difference $\Delta R$ between the first cell resistance $R_{C1}$ and the second cell resistance $R_{C2}$ obtained for different first write data written in the first magnetic tunnel junction 2 ($MTJ_1$) and different second write data written in the second magnetic tunnel junction 2' ($MTJ_2$). The MRAM-based TCAM cell 1 disclosed herein thus allows for writing three distinct cell logic states.

TABLE 3

| $MTJ_1$ | $MTJ_2$ | $\Delta R$ | cell logic state |
|---|---|---|---|
| 0 | 0 | <0 | 0 |
| 0 | 1 | 0 | X |
| 1 | 0 | 0 | X |
| 1 | 1 | >0 | 1 |

Figure 2:
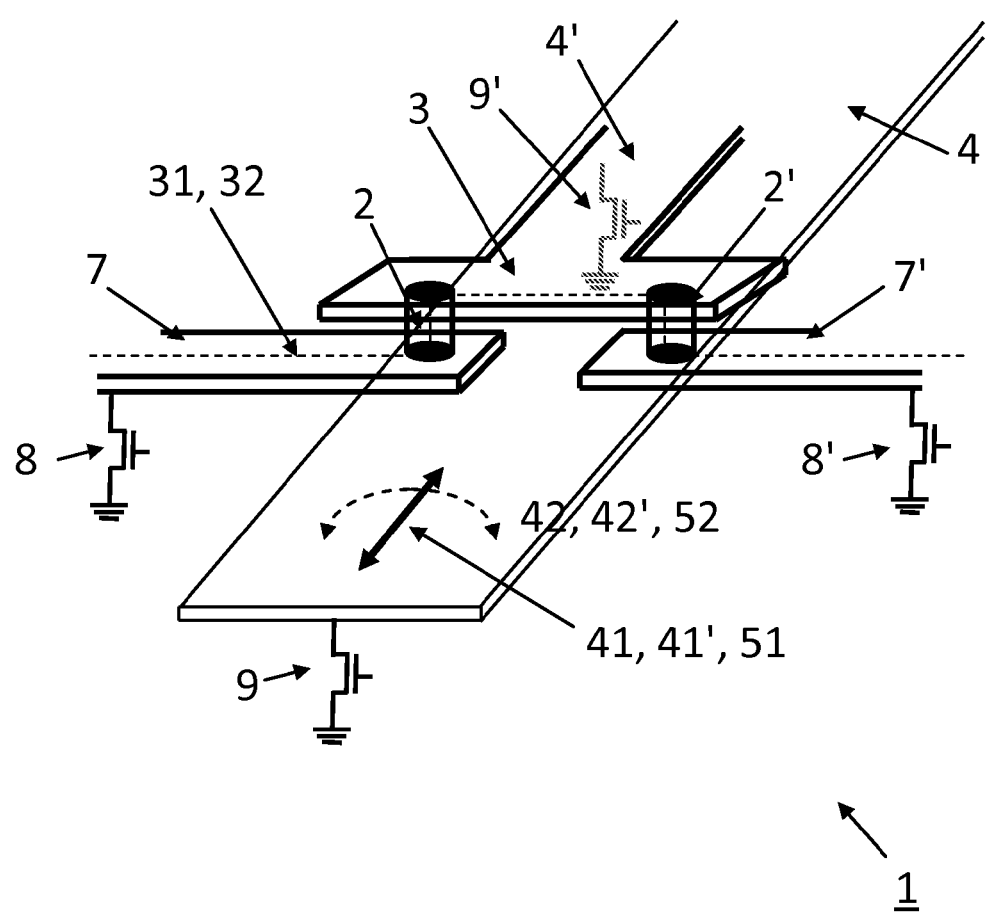
FIG. 2 shows the MRAM-based TCAM cell comprising the first and second magnetic tunnel junction, according to another embodiment.

In another embodiment represented in FIG. 2, the MRAM-based TCAM cell 1 comprises the second current line 4 in electrical contact with the conductive line 3. In the example of FIG. 2, the second current line 4' extends from the conductive line 3, substantially parallel with the first current line 4. In this configuration, one of the two magnetic tunnel junctions 2, 2' can be addressed selectively. More particularly, the heating current 31 and the search current 32 can be passed selectively in one of the two magnetic tunnel junctions 2, 2'. Here, passing the heating current 31 and the search current 32 selectively in one of the two magnetic tunnel junctions 2, 2' comprises passing the current 31, 32 via the second current line 4', a portion of the conductive line 3 between the second current line 4' and the one of the two magnetic tunnel junctions 2, 2', and the corresponding strap 7, 7'. The second current line 4' can be substantially parallel with the first current line 4 or substantially perpendicular, or make any other angle with the first current line 4. The MRAM-based TCAM cell 1 according to the present embodiment results in a denser structure than the MRAM-based TCAM cell 1 disclosed in the embodiment of FIG. 1.

The MRAM-based TCAM cell 1 having the configuration of FIG. 2 This second embodiment proposes a denser structure, but slower than the first embodiment. During the search operation, a search field current having a sequentially changing polarity is passed in the current line. Preferably, the search field current 51 has an alternating current inducing the search magnetic field 52 with a direction varying accordingly.

During the write operation for writing a cell logic state "0" or "1" to the MRAM-based TCAM cell 1 in the configuration of FIG. 2 (i.e., writing both the first and second magnetic tunnel junctions 2, 2' respectively with both the first and second write data having a state "0" or a state "1") can comprise passing the heating current 31 in the two magnetic tunnel junctions 2, 2' via the conductive line 3 and the straps 7, 7'. Switching the storage magnetization 230 of the first and second magnetic tunnel junctions 2, 2' can be performed by passing the first and second field currents 41, 41' in the first current line 4. In particular, a single field current can be passed in the first current line 4 used as a single current line. The single field current can be made large enough for switching the storage magnetization 230 in the two magnetic tunnel junctions 2, 2'. Here, writing the first and second write data is performed simultaneously for both the first and second magnetic tunnel junctions 2, 2'.

When writing a cell logic state "X" in the MRAM-based TCAM cell 1 (i.e., writing the first and second magnetic tunnel junctions 2, 2' with the first and second write data having a state "0" or a state "1", respectively, or having a state "1" or a state "0", respectively) can comprise:

passing the heating current 31 selectively in the first magnetic tunnel junction 2;

switching the storage magnetization 230 of the first magnetic tunnel junction 2 such as to write the first write data having a state "0" or "1";

passing the heating current 31 selectively in the second magnetic tunnel junction 2'; and switching the storage magnetization 230 of the second magnetic tunnel junction 2' such as to write the second write data having a state "1" or "0".

Switching the storage magnetization 230 of the first magnetic tunnel junction 2 can be performed by passing the first field current 41 in the first current line 4. Switching the storage magnetization 230 of the second magnetic tunnel junction 2' can be performed by passing the second field current 41' also in the first current line 4 with a polarity opposite to the one of the first field current 4. Alternatively, the second field current 41 could be passed in the second current line 4'. Here, writing the first and second write data is performed sequentially for the first magnetic tunnel junction 2 and the second magnetic tunnel junction 2'.

The self-referenced search operation of the MRAM-based TCAM cell 1 having the configuration of FIG. 2 can comprise the same steps as described above. Aligning the search magnetization 210 can be performed by passing the search current 51 in the first current line 4 such as to generate the search magnetic field 52.

A magnetic memory device (not shown) can be formed by assembling an array comprising a plurality of the MRAM-based TCAM cell 1. The array of MRAM-based TCAM cells 1 can be disposed within a device package (also not shown).

REFERENCE NUMBERS 1 magnetic random access memory (MRAM) cell
2 first magnetic tunnel junction
2' second magnetic tunnel junction
21 search layer
210 sense magnetization
22 tunnel barrier layer
23 storage layer
230 storage magnetization
3 conductive line
31 heating current
32 search current
4 first current line
4' second current line
41 first field current
41' second field current
42 first magnetic field
42' second magnetic field
51 search current
52 search magnetic field
7 first conducting strap
7' second conducting strap
8 first selection transistor
8' second selection transistor
9 first field select transistor
9' second field select transistor
$\Delta R$ difference between first cell resistance and second cell resistance
$R_{C1}$ first cell resistance
$R_{C2}$ second cell resistance
$R_{min}$ minimum junction resistance
$R_{max}$ maximum junction resistance
$R_{mtj1}$ first junction resistance
$R_{mtj2}$ second junction resistance

The invention claimed is:

1. Self-referenced magnetic random access memory-based ternary content addressable memory (MRAM-based TCAM) cell comprising a first and second magnetic tunnel junction, each magnetic tunnel junction comprising a search layer having a search magnetization that can be freely varied, a storage layer having a storage magnetization that can be switched from a first stable direction to a second stable direction when the magnetic tunnel junction is at a high temperature threshold; and a tunnel barrier layer between the search and storage layers;

a first conducting strap in electrical communication with one end of the first magnetic tunnel junction;

a second conducting strap in electrical communication with one end of the second magnetic tunnel junction;

a conductive line in electrical communication with the other end of the first and second magnetic tunnel junctions such that the two magnetic tunnel junctions are connected in series;

a first current line for passing a first field current generating a first magnetic field to write a first write data to the first magnetic tunnel junction; and a second current line for passing a write current independently from passing the first field current in the first current line to write a second write data to the second magnetic tunnel junction selectively from the writing of the first write data, such that three distinct cell logic states can be written in the MRAM-based TCAM cell.

2. MRAM-based TCAM cell according to claim 1, wherein the write current comprises a second field current generating a second magnetic field.

3. MRAM-based TCAM cell according to claim 2, wherein the write current further comprises a heating current, and wherein the cell is arranged for passing the heating current in the two magnetic tunnel junctions via the conductive line, the first strap, and the second strap, such that the two magnetic tunnel junctions can be simultaneously heated at the high temperature threshold.

4. MRAM-based TCAM cell according to claim 1, wherein the write current comprises a heating current and wherein the second current line is electrically connected to the conductive line such that the heating current can selectively pass in each of the two magnetic tunnel junctions via a portion of the conductive line and the second current line, such that each of the two magnetic tunnel junctions can be heated selectively.

5. MRAM-based TCAM cell according to claim 4, wherein the write current further comprises a second field current, and wherein the cell is arranged for passing the second field current in the first current line.

6. A magnetic memory device comprising a plurality of MRAM-based TCAM cells, each MRAM-based TCAM cell comprising a first and second magnetic tunnel junction each comprising a search layer having a search magnetization that can be freely varied, a storage layer having a storage magnetization that can be switched from a first stable direction to a second stable direction when the magnetic tunnel junction is at a high temperature threshold; and a tunnel barrier layer between the search and storage layers; a first conducting strap in electrical communication with one end of the first magnetic tunnel junction; a second conducting strap in electrical communication with one end of the second magnetic tunnel junction; a conductive line in electrical communication with the other end of the first and second magnetic tunnel junctions such that the two magnetic tunnel junctions are connected in series; a first current line for passing a first field current generating a first magnetic field to write a first write data to the first magnetic tunnel junction; and a second current line for passing a write current independently from passing the first field current in the first current line to write a second write data to the second magnetic tunnel junction selectively from the writing of the first write data, such that three distinct cell logic states can be written in the MRAM-based TCAM cell.

7. A method of writing to a MRAM-based TCAM cell comprising a first and second magnetic tunnel junction each comprising a search layer having a search magnetization that can be freely varied, a storage layer having a storage magnetization that can be switched from a first stable direction to a second stable direction when the magnetic tunnel junction is at a high temperature threshold; and a tunnel barrier layer between the search and storage layers; a first conducting strap in electrical communication with one end of the first magnetic tunnel junction; a second conducting strap in electrical communication with one end of the second magnetic tunnel junction; a conductive line in electrical communication with the other end of the first and second magnetic tunnel junctions such that the two magnetic tunnel junctions are connected in series; a first current line for passing a first field current generating a first magnetic field to write a first write data to the first magnetic tunnel junction; and a second current line for passing a write current independently from passing the first field current in the first current line to write a second write data to the second magnetic tunnel junction selectively from the writing of the first write data, such that three distinct cell logic states can be written in the MRAM-based TCAM cell; the method comprising:
selectively writing a first write data to the first magnetic tunnel junction and selectively writing a second write data to the second magnetic tunnel junction, such as to write a cell logic state in the MRAM-based TCAM cell.

8. Method according to claim 7, wherein
said write current comprises a second field current generating a second magnetic field, and wherein
said selectively writing a first and second write data to the first and second magnetic tunnel junction, respectively, comprises:
heating the first and second magnetic tunnel junctions to the high temperature threshold; and
passing the first field current having a first polarity in the first current line for switching the storage magnetization of the first magnetic tunnel junction in accordance with the first polarity; and passing the second field current having a second polarity in the second current line for switching the storage magnetization of the second magnetic tunnel junction in accordance with the second polarity.

9. Method according to claim 8, wherein
said write current further comprises a heating current, and wherein said heating the first and second magnetic tunnel junction comprises passing the heating current in the two magnetic tunnel junctions via the conductive line, the first strap, and the second strap.

10. Method according to claim 7, wherein
said write current comprises a heating current, and said second current line is electrically connected with the conductive line; and wherein
said selectively writing a first and second write data to the first and second magnetic tunnel junction, respectively, comprises:
selectively heating the first magnetic tunnel junction to the high temperature threshold
passing the first field current having a first polarity in the first current line for switching the storage magnetization of the first magnetic tunnel junction in accordance with the first polarity;
selectively heating the second magnetic tunnel junction to the high temperature threshold; and
passing a second field current having a second polarity in the first current line for switching the storage magnetization of the second magnetic tunnel junction in accordance with the current polarity.

11. Method according to claim 10, wherein
said selectively heating the first magnetic tunnel junction comprises passing the heating current in the first magnetic tunnel junction via the second current line, a first portion of the conductive line, and the first strap; and
said selectively heating the second magnetic tunnel junction comprises passing the heating current in the second magnetic tunnel junction via the second current line, a second portion of the conductive line, and the second strap.

12. Method according to claim 8, wherein
the first polarity is the same as the second polarity such as to write a high ("1") or a low ("0") cell logic state in the MRAM-based TCAM cell; or the first polarity is opposite to the second polarity such as to write a don't-care ("X") cell state logic state in the MRAM-based TCAM cell.

13. Method of searching the MRAM-based TCAM cell comprising a first and second magnetic tunnel junction each comprising a search layer having a search magnetization that can be freely varied, a storage layer having a storage magnetization that can be switched from a first stable direction to a second stable direction when the magnetic tunnel junction is at a high temperature threshold; and a tunnel barrier layer between the search and storage layers; a first conducting strap in electrical communication with one end of the first magnetic tunnel junction; a second conducting strap in electrical communication with one end of the second magnetic tunnel junction; a conductive line in electrical communication with the other end of the first and second magnetic tunnel junctions such that the two magnetic tunnel junctions are connected in series; a first current line for passing a first field current generating a first magnetic field to write a first write data to the first magnetic tunnel junction; and a second current line for passing a write current independently from passing the first field current in the first current line to write a second write data to the second magnetic tunnel junction selectively from the writing of the first write data, such that three distinct cell logic states can be written in the MRAM-based TCAM cell the method comprising:

aligning the search magnetization of the first and second magnetic tunnel junctions in a first search direction;

measuring first cell resistance;

aligning the search magnetization of the first and second magnetic tunnel junctions in a second search direction;

measuring second cell resistance; and determining the cell logic state by the difference between the first and second cell resistance.

14. Method according to claim 13, wherein said aligning the search magnetization in a first search direction comprises passing a search current having a first polarity in the first and/or second current lines, and wherein said aligning the search magnetization in a second search direction comprises passing the search current having a second polarity, opposed to the first, in the first and/or second current lines.

15. Method according to claim 13, wherein said measuring first and second cell resistances comprises passing a search current in the first and second magnetic tunnel junctions via the conductive line and the first and second straps.

\* \* \* \* \*

UNITED STATES PATENT AND TRADEMARK OFFICE
CERTIFICATE OF CORRECTION

| | |
|---|---|
| PATENT NO. | : 8,885,379 B2 |
| APPLICATION NO. | : 13/764139 |
| DATED | : November 11, 2014 |
| INVENTOR(S) | : Jeremy Alvarez-Herault |

It is certified that error appears in the above-identified patent and that said Letters Patent is hereby corrected as shown below:

In the specification, column 8, line 17, please replace "AR" with -- $\Delta R$ --

Signed and Sealed this
First Day of March, 2016

Michelle K. Lee
*Director of the United States Patent and Trademark Office*